United States Patent [19]

Evans

[11] Patent Number: 4,719,417

[45] Date of Patent: * Jan. 12, 1988

[54] MULTI-LEVEL TEST PROBE ASSEMBLY FOR IC CHIPS

[75] Inventor: Arthur Evans, Broofield Center, Conn.

[73] Assignee: Wentworth Laboratories, Inc., Brookfield, Conn.

[*] Notice: The portion of the term of this patent subsequent to Jul. 8, 2003 has been disclaimed.

[21] Appl. No.: 850,629

[22] Filed: Apr. 11, 1986

Related U.S. Application Data

[63] Continuation-in-part of Ser. No. 757,502, Jul. 22, 1985, Pat. No. 4,599,559, which is a continuation-in-part of Ser. No. 491,233, May 3, 1983, abandoned.

[51] Int. Cl.⁴ ............................................. G01R 1/073
[52] U.S. Cl. ............................ 324/158 P; 324/158 F; 324/72.5
[58] Field of Search ............... 324/72.5, 73 PC, 158 P, 324/158 F; 29/574

[56] References Cited

U.S. PATENT DOCUMENTS

| | | | |
|---|---|---|---|
| 3,445,770 | 5/1969 | Harmon | 324/158 P |
| 3,596,228 | 7/1971 | Reed, Jr. et al. | 324/158 P |
| 3,806,801 | 4/1974 | Bove | 324/72.5 |
| 3,835,381 | 9/1974 | Garretson et al. | 324/158 P |
| 3,911,361 | 10/1975 | Bove et al. | 324/158 P |
| 4,480,223 | 10/1984 | Aigo | 324/158 P |
| 4,523,144 | 6/1985 | Okubo et al. | 324/158 P |
| 4,599,559 | 7/1986 | Evans | 324/158 F |

OTHER PUBLICATIONS

"Cantilever Probe", by Altonen et al, IBM Tech. Disc. Bull., vol. 24, #6, 11/81, p. 2687.
"A Neutron Hardness Assurance Screen Based on High-Frequency Probe Measruements", by Bailey et al, IEEE Trans. on Tech. Sci., vol. NS-23, #6, 12/76, pp. 2020, 2021, 2023.

Primary Examiner—Reinhard J. Eisenzopf
Assistant Examiner—W. Burns
Attorney, Agent, or Firm—Michael Ebert

[57] ABSTRACT

A multi-level test probe assembly for checking an integrated circuit chip before terminal leads are applied to the contact pads thereof which are deployed on the chip on a common plane, some pads being inwardly displaced relative to other pads. The assembly includes a planar insulation card provided with a port and having a printed circuit thereon whose traces are connected to a plurality of test terminals connectable to external testing equipment. Surrounding the port and bonded to the card is a mounting ring of dielectric material having a flat face on which is supported a first radial array of fine wires lying in a horizontal plane, the trailing end of each wire being connected to a respective trace. The wires cantilever across the port and converge toward the central region thereof below which is disposed the chip to be tested, the tapered leading end of each wire being double bent to define a needle having a shank section and a tip section terminating in a tip which engages a respective contact pad on the chip. Overlying the first layer and bonded thereto is a second layer of dielectric material having embedded therein a second radial array of fine wires whose tips engage those contact pads on the chip not engaged by the first array.

6 Claims, 10 Drawing Figures

MULTI-LEVEL TEST PROBE ASSEMBLY FOR IC CHIPS

RELATED APPLICATION

This application is a continuation-in-part (C-I-P) of my copending U.S. application Ser. No. 757,502, filed July 22, 1985, U.S. Pat. No. 4,599,559, which in turn is a continuation-in-part of my copending U.S. application Ser. No. 491,233, filed May 3, 1983, now abandoned, the entire disclosures of these earlier cases being incorporated herein by reference.

BACKGROUND OF INVENTION

Field of Invention

This invention relates generally to the testing of integrated circuit chips, and, more particularly to a microelectronic test probe assembly for this purpose.

Many circuits and complex multi-stage electronic systems previously regarded as economically unfeasible and impractical, are now realizable in integrated circuit form. The fabrication of a single-crystal monolithic circuit involves the formation of diodes, transistors, resistors and capacitors on a single microelectronic substrate. In practice, a microelectronic substrate for semiconductor integrated circuits is sealed on a silicon wafer, the circuit patterns being applied to the wafer by photolithography. Each wafer contains the patterns of many identical integrated circuits, the wafer being sliced into "dice," each die or chip containing a single integrated circuit.

In a typical integrated circuit (IC) chip, the input, output, power supply and other terminals of the circuit are formed by metallized contact pads, usually deployed along the margins of the circuit pattern. The outline of the chip is either square or rectangular, and the marginal locations of the contact pads thereon depend on the circuit configuration and the available marginal space. In some instances, therefore, the contact pads may lie in uniform rows along the margins, and in other cases, the contact pads may be randomly spaced from each other.

For the purpose of testing any type of integratedcircuit patterns, before the application thereto of leads to connect the contacts to other components, various types of test probe cards have been developed. In one well-known form, the probe card consists of a printed circuit board having an opening or port therein to provide access to an IC pattern. This opening is surrounded by a circle of conductive pads connected by the traces of the printed circuit to terminals on the card which, in turn, are connected to test equipment appropriate to the circuit. The number of pads in the circle determines the maximum capacity of the probe card. If, for example, the card has forty-eight conductive pads, it is capable of testing IC patterns having forty-eight contact pads or less.

In setting up a probe card for a particular IC chip pattern, probes constituted by needles of tungsten are affixed to selected conductive pads, the needles extending across the opening. The length and orientation of each needle is such that its point is adapted to engage a respective contact pad on the IC pattern.

To assemble a probe card for this pattern, one must attach needles to those conductive pads which are most conveniently located with respect to the contact pads on the chip. The stretch of each needle depends on the distance between its conductive pad on the card and the particular contact pad to be engaged. Hence the needles in a conventional probe card vary in length.

Since all of the contact pads on the IC pattern lie in a common plane and must be simultaneously engaged in order to carry out testing, it is essential that all needle points lie in a plane parallel to the common IC plane. Consequently, a fundamental requirement of a probe card is planarization of the needle points. The nature of conventional probe cards and the character of the assembly fixtures for setting up the probe positions for such cards are such that it is virtually impossible to assemble probes with needle points lying exactly in the same plane.

With a view to providing an improved microelectronic test probe card, the Garretson et al. U.S. Pat. Nos. 3,835,381 and 3,905,098 disclose a structure in which needle-like probes formed of tungsten wire are supported on the tapered face of a dielectric base ring surrounding a circular opening in the card, the wires being in a generally conical array with respect to the opening. A layer of dielectric material adherent to the tapered surface of the ring acts to secure the wires thereto, the wires being embedded in the layer. The outer ends of the wires are connected to terminals on the card, whereas the inner ends leading to the apex of the cone are bent down to form tips which engage the respective contacts on the IC chip to be tested.

Because the tips of the needles must all lie in a common plane, the angles of the needles in the conical array thereof must be adjusted relative to the tapered surface of the ring to engage the respective contacts on the chip. Thus, a steeper angle is required to reach a contact, say, at the corner of the rectangular chip than a contact displaced from a corner. To this end, feeler gauges are used by Garretson et al. to control the positions and locations of each needle on the tapered face of the ring.

After the needles have been carefully adjusted to assume their proper angles, an epoxy or other dielectric material is superimposed over the array of needle probes so as to embed the probes at their assigned angle and position in the epoxy. The assembly so arranged is then heated to cause hardening of the epoxy to thereby retain the array of needles at their selected sites.

In practice, it is a relatively difficult matter to construct a test probe card of the Garretson et al. type, for to create the necessary conical array of needles, one must use a jig having a conical configuration; and because the needles must be positioned at various angles relative to the conical surface of the jig, the needles make point contact with the jig only at the back end thereof and tend to fall out of position. Also, it is difficult to set the needles relative to the jig to allow proper clearance therebetween for epoxy flow.

A further disadvantage is that because the needles are at different angles, the scrub characteristics of the needles are not uniform. Moreover, as needles are added to the jig, it is impossible to control the final angle of each needle, as all needles in the jig have slightly different angles due to the cone effect.

When the needles are brought into engagement with the contact pads on the chip, the tips scrub the pad surfaces to remove oxide film therefrom and thereby improve electrical contact therewith. But if the scrubbing action of the needles is not uniform, then some of the needles will go beyond the pads and invade the surface of the chip and do damage to the circuit.

A proper scrubbing action is important, for without scrubbing to remove non-conductive oxide material from the engaged contact pads on the chip being tested, the needles will make poor electrical contact therewith and an effective test cannot be performed.

In my copending U.S. application Ser. No. 757,502, there is disclosed a probe test assembly for testing integrated circuit chips in which a radial array of fine wires, all lying in a horizontal plane, are supported on a mounting ring surrounding a circular port in a card, the wires converging toward the central region of the port below which is exposed the chip to be tested. The leading end of each wire is tapered and double bent to define a needle having a shank section and a relatively short tip section terminating in a tip which engages a respective contact pad of the chip. The tip sections are sloped to expose the tips to view.

Among the advantages of a probe test assembly of this type over a prior art assembly in which the wires lie in a conical array is that the slope angle between each needle tip section and the surface of the chip or other microelectronic device under test is uniform. As a consequence, all tips at the ends of the needles may be identically viewed under a microscope, thereby facilitating alignment and placement of the probe card when in use for electrical testing and measurement. Also, this probe test assembly has uniform and consistent scrubbing characteristics.

The probe card assembly disclosed in my copending U.S. application Ser. No. 757,502 is characterized by a high needle density capability. The reason for this is that the diameter at the junction of the shank section of the tapered needle and the tip section thereof is substantially smaller than the diameter of the untapered wire. Thus, many more needles may be included in the wire array than would otherwise be possible.

However, with IC chips of the type now in use, the number of contact pads thereon is in some instances so great that a single high-density array of wires, as in my copending application, is insufficient to make contact with all of the contact pads on the chip. If, for example, there is a multiplicity of contact pads deployed along the margins of the chip and still many more contact pads dispersed inwardly of the margins, it may not be possible with a single array of wires to effect engagement with all of these contact pads.

Of background interest are the following references: the U.S. Pat. Nos. to Ardezzone, 3,891,924; Tarzwell, 4,161,692; Harmon, 3,445,770; and Hostetter, 3,613,001; the Japanese patent Nos. to Hasagawa, 0135938 and Ookubo, 0023437; the West German patent Nos. 1,910,314 to Epple; and the IBM Technical Disclosure Bulletin, Vol. 18, No. 10, March 1976, Byrnes, H., "Test Contactor".

SUMMARY OF INVENTION

In view of the foregoing, the main object of this invention is to provide a probe test assembly capable of testing integrated circuit chips having a large number of contact pads thereon.

More particularly, an object of this invention is to provide a multi-level assembly of the above type having at least two radial arrays of fine wires in superposed relation and insulated from each other, the leading ends of wires in each array being tapered and double bent to define needles whose tip sections terminate in tips which engage respective contacts of the chip.

A significant feature of the invention is that each wire array is characterized by a high needle density capability, and that the combined needle density of at least two such wire arrays makes it possible to test integrated circuit chips having an exceptionally large number of contact pads.

Also an object of this invention is to provide a test probe assembly whose tips at the ends of the needles may be readily viewed under a microscope to facilitate alignment and placement of the probe card. Thus, all of the advantages of the assembly disclosed in the copending case are retained.

Briefly stated, these objects are attained in a multi-level test probe assembly for checking an integrated circuit chip before terminal leads are applied to the contact pads thereof which are deployed on the chip on a common plane, some pads being inwardly displaced relative to other pads. The assembly includes a planar insulation card provided with a port and having a printed circuit thereon whose traces are connected to a plurality of test terminals connectable to external testing equipment. Surrounding the port and bonded to the card is a mounting ring of dielectric material having a flat face on which is supported a first radial array of fine wires lying in a horizontal plane, the trailing end of each wire being connected to a respective trace. These wires are maintained in their assigned positions by a first layer of dielectric material adherent to the face of the ring, the wires being embedded in this layer, thereby defining the first level of the assembly. The wires cantilever across the port and converge toward the central region thereof below which is disposed the chip to be tested, the tapered leading end of each wire being double bent to define a needle having a shank section and a tip section terminating in a tip which engages a respective contact pad on the chip. Overlying the first layer and bonded thereto is a second layer of dielectric material having embedded therein a second radial array of fine wires whose tips engage those contact pads on the chip not engaged by the first array, thereby defining the second level of the assembly. Additional levels may be formed in the same manner.

OUTLINE OF DRAWINGS

For a better understanding of the invention as well as other objects and further features thereof, reference is made to the following detailed description to be read in conjunction with the accompanying drawings, wherein.

Figure 3:
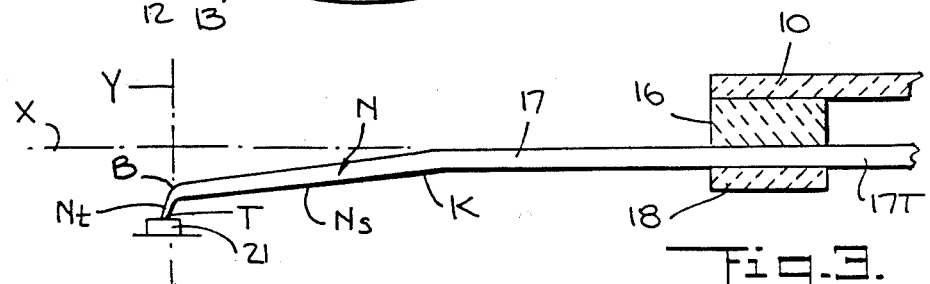
Figure 4:
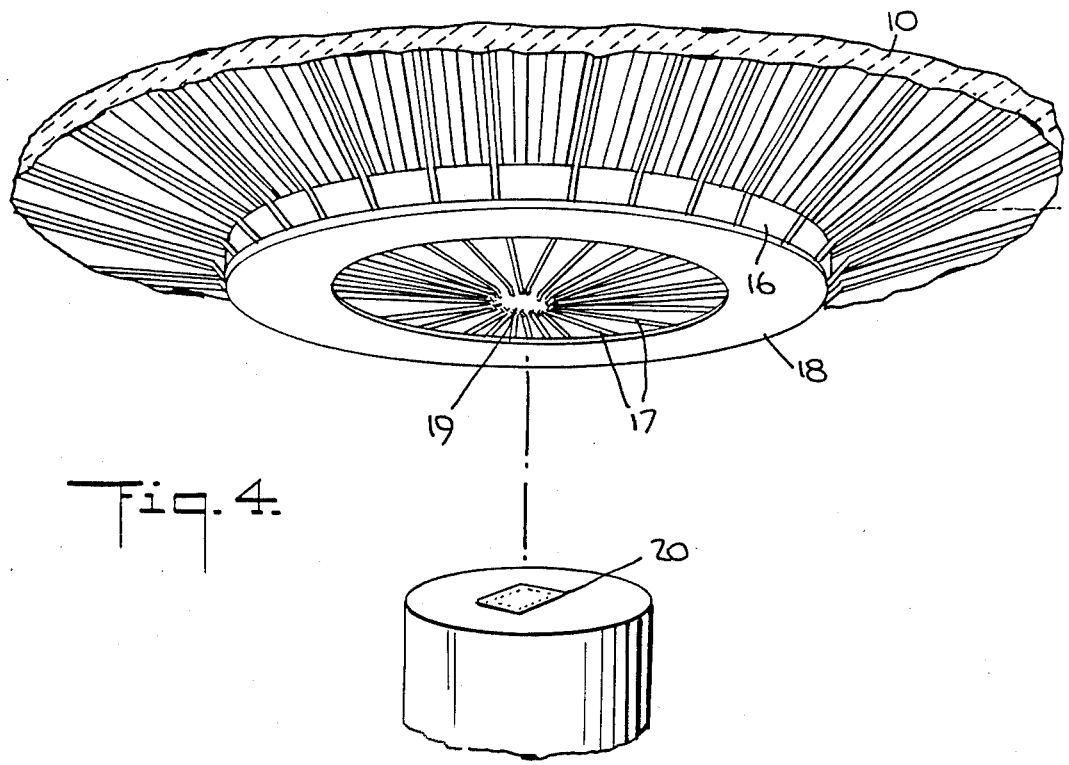
Figure 5:
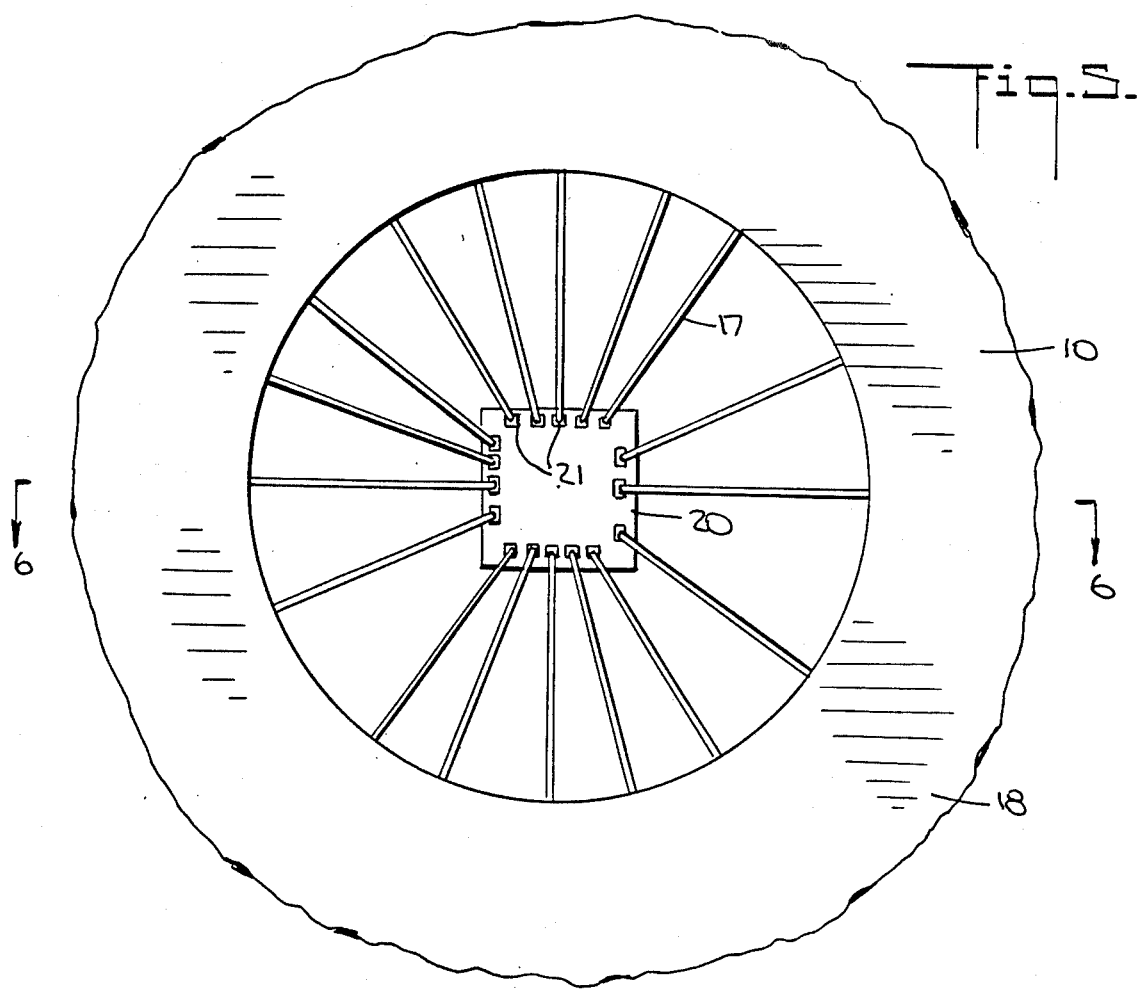
Figure 6:
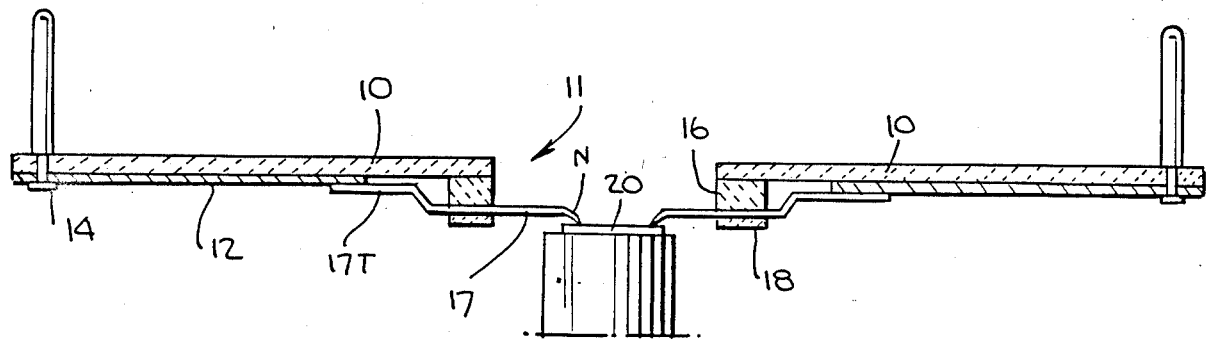
Figure 7:
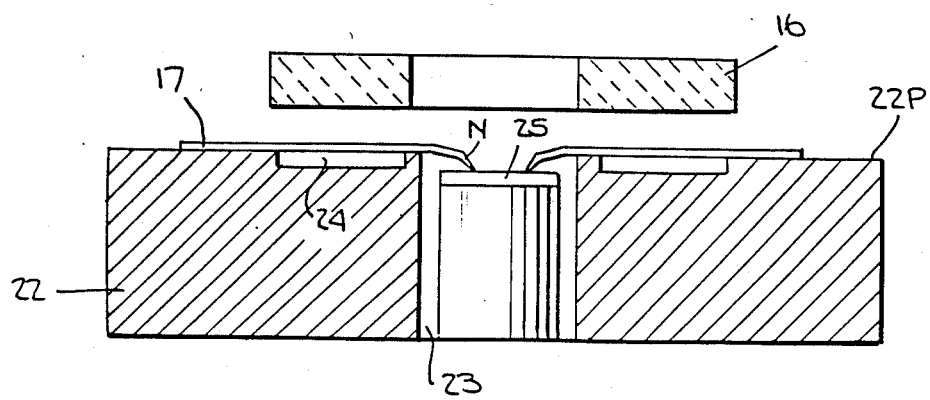
Figure 8:
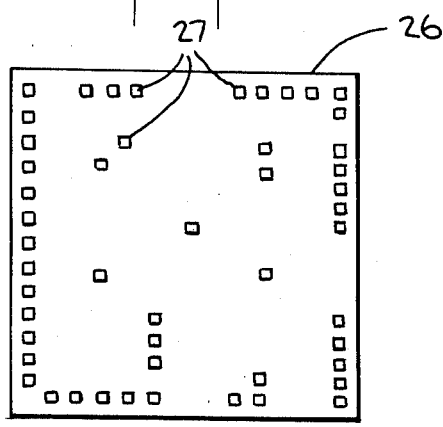
Figure 9:
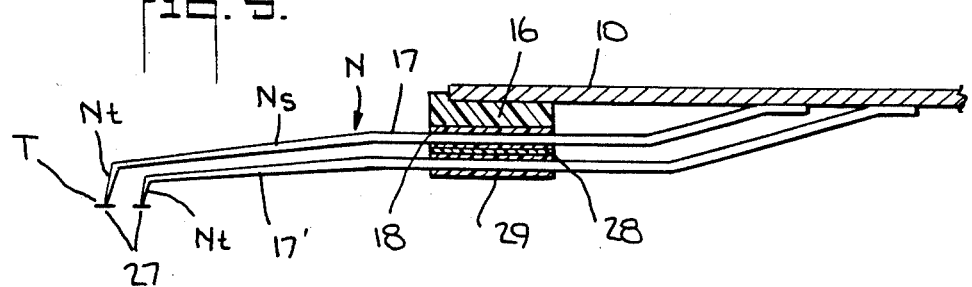
Figure 10:
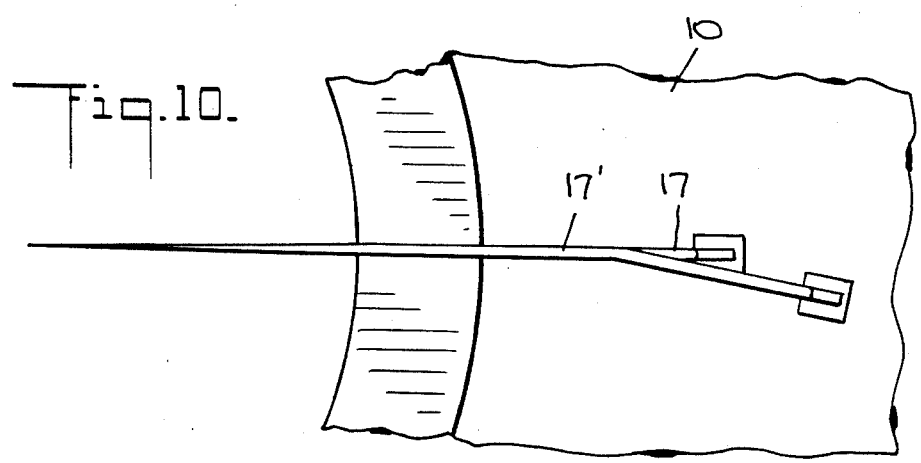

FIG. 3 separately illustrates, in section, the mounting ring of the card and a single probe supported thereby;

FIG. 4 is a perspective view illustrating the relationship of the test probe assembly to an IC chip to be tested thereby;

FIG. 5 is an enlarged view of the chip being tested, with the needles of the assembly in engagement with the contacts of the chip;

FIG. 6 is a section taken in the plane indicated by line 6—6 in FIG. 5;

FIG. 7 is a sectional view of the jig for setting up the array of probe wires to be supported on the ring;

FIG. 8 is a plan view of an IC chip to be tested having a large number of contact pads;

FIG. 9 is a sectional view of a multi-level test probe assembly in accordance with the invention; and FIG. 10 is a plan view of the assembly shown in FIG. 9.

DESCRIPTION OF INVENTION

Single Level Assembly

Figure 1:
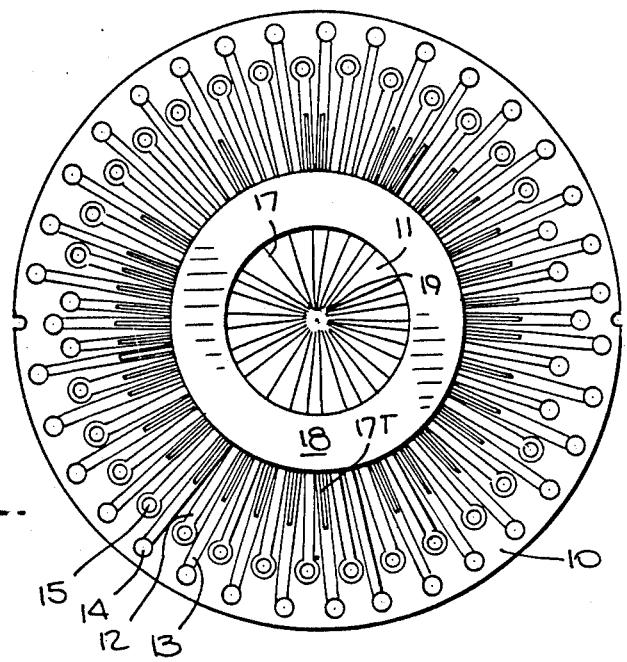
FIG. 1 is a bottom plan view of a preferred embodiment of a single level test probe assembly in accordance with the invention.
Figure 2:
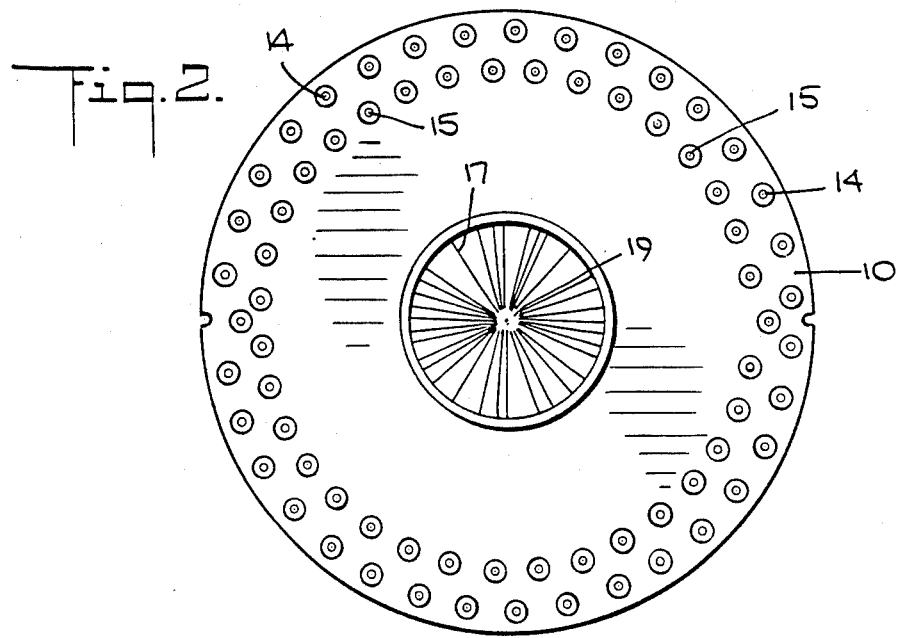
FIG. 2 is a top plan view of the assembly.

Referring now to FIGS. 1 and 2, there is illustrated a preferred embodiment of a test probe assembly in accordance with the invention for checking an integrated circuit chip before leads are connected to the contact pads on the chip. The function of the test probe assembly is to engage the chip contacts and connect them to test terminals which in turn are connected to external test equipment so that the chip circuits may be fully tested to be sure that it satisfies the specifications therefor before the chip is permanently connected to its associated components.

The assembly includes a planar printed circuit board or card 10 fabricated of synthetic plastic or other insulating material which is structurally stable and of adequate strength. Card 10, which in the embodiment illustrated is circular in form, is provided with a circular central opening or port 11 to provide access to the chip to be tested. In practice, the planar card may be rectangular or in any other suitable configuration; and the port, rather than being circular, may be oblong or in any other geometrical form.

Formed on one face of card 10 by printed circuit techniques are two sets 12 and 13 of radial traces which are interleaved. Traces 13 which are conductive are connected to test terminals 14 in an outer circular series thereof adjacent the periphery of card 10. Conductive traces 12, which are somewhat shorter than traces 13, are connected to test terminals 15 in an inner circular series thereof concentric with the outer series. The advantage of this interleaved arrangement of radial traces is that it makes possible a high density of test terminals in a relatively small area.

Each test terminal on the card takes the form of a metal grommet inserted in a card hole and adapted to receive a plug-in pin P6, as shown in FIG. 6, whereby the assembly can be plugged into a test equipment socket rather than being wired thereto terminal by terminal. In practice, the grommets, instead of being discrete elements, may be formed by plating the hole surfaces. Also, the terminals may take the form of edge contacts plated on the surface of the card.

Surrounding port 11 and secured to the card, as shown in FIGS. 3 and 4, is a mounting ring 16 which may be formed of ceramic, anodized aluminum or other dielectric material. The ring thus has a flat face parallel to the plane of the card for supporting at a raised position a radial array of fine wires 17, preferably made of tungsten. These wires are maintained in their assigned positions by a layer 18 of dielectric material which is adhered to the face of the ring, the wires being embedded therein. In practice, the layer may be molded of epoxy resin.

Wires 17 cantilever across port 11 and converge toward the central region 19 thereof, as shown in FIG. 4, just below which is the integrated circuit chip 20 to be tested. Chip 20, as shown in FIG. 5, has contact pads 21 deployed thereon, all lying in a common horizontal plane, the contact pads being located adjacent the margins of the chip.

As best seen in FIG. 3, the leading end of each wire 17 is tapered to define a needle N. Needle N is double bent to form a relatively long shank section $N_s$ and a short tip section $N_t$ terminating in a tip T. This tip engages a contact pad 21 on the chip to be tested when the chip is raised toward the test probe assembly.

Each wire 17, which is secured to the flat face of mounting ring 16 by dielectric layer 18, extends along a horizontal axis X. The shank section $N_s$ of the double bent needle N is downwardly inclined at an acute angle which in practice may be 8 degrees relative to horizontal axis X. The tip section $N_t$ of the needle has a downward slope and is at an acute angle with respect to the vertical axis Y. In practice, this angle may be 15 degrees. Hence, the angle between tip section $N_t$ and shank section $N_s$ is obtuse.

These needle angles are uniform throughout the array of wires. And because the needle tips T in the array thereof lie at the ends of the sloped tip sections $N_t$, all of which have the same angle, they can readily be viewed through a microscope placed above the test probe assembly. In the present arrangement, the sloped tip sections of the needles do not block such viewing, as would be the case where the tip sections of the needles lie along a vertical axis at right angles to the cantilevered wires. This ability to view the tips through a microscope facilitates the alignment and placement of the test probe assembly when in use for electrical testing and measurement.

When the IC chip to be tested is raised upwardly to engage tip T of the probe, further upward movement of the tip causes the double-bent needle N to swing about the knee K where needle N joins wire 17. This swing gives rise to a slight lateral displacement of tip T along the surface of contact pad 21 engaged thereby to provide a desirable scrubbing action.

The present industry requirement in the IC test field is for a scrub of 0.0001 inch for each 0.001 inch of vertical movement of the probe tip. Vertical movement of the probe tip, or overdrive as it is called in the trade, is typically 0.003 to 0.005 inches of scrub. The geometry of the double bent needle N is such as to satisfy these requirements in a uniform and consistent manner, for all needles have the same geometry.

The trailing ends 17T of wires 17 which diverge outwardly from the ring, as shown in FIGS. 1 and 6, are soldered to individual traces on the printed circuit, so that each needle is connected to a respective test terminal 14 or 15 in the inner and outer series thereof.

The number of wires 17 in the array and their placement are determined by the number of contacts 21 and their placement on the integrated circuit chip 20 to be tested. Thus in the chip illustrated in FIG. 5, there are a relatively small number of contacts 21 deployed on chip 20; hence an equally small number of wires are required in the radial array, the placement of the wires being determined by the placement of these contacts. In practice, a much greater number of contacts and wires may be involved.

Fabrication of Sub-Assembly

Referring now to FIG. 7, there is shown a jig 22 for fabricating a sub-assembly in accordance with the invention, the sub-assembly being in the form of a spider-like structure in which a radial array of wires whose leading ends are needles, is supported on mounting ring 16, the wires being maintained at their assigned positions by a layer 18 of epoxy material adherent to the face of the ring, the wires being embedded therein.

Jig 22 is provided with a planar face 22P and a central circular bore 23. An annular channel 24 is formed in the top face of jig 22 and is concentric with bore 23 to receive the flow of the moldable, resinous dielectric material.

Metal wires 17 of high conductivity are laid down on planar face 22P to create the desired radial array, the obtuse-angle needles N lying within bore 23, with the needle tips being received in the separate apertures of a patterned mask 25. This mask is preferably formed of a thin sheet of "Mylar" in a selected pattern determined by the contact pad positions of the chip to be tested. Channel 24 is of uniform depth to form the desired thickness of the adhered layer 18. These wires may be of tungsten, beryllium-copper or other suitable metal alloys.

After the wires are properly set up on the jig, ring 16, whose underside is coated with an epoxy layer, is brought down on the array and clamped to the jig in a fixture. This fixture is then placed in an oven and heated to a temperature of about 200° F. for a period, such as one hour, sufficient to effect curing and hardening of the resinous layer of dielectric epoxy in which the wires are embedded.

The resultant spider sub-assembly is removed from the fixture, the ring is bonded to the card around the port therein, and finally the trailing ends of the wires are soldered to the traces of the printed circuit.

The wires 17 are of uniform diameter and the preferred technique for tapering the leading end of each wire to create the tapered needle N is by electrochemical etching. This is carried out by computer control to maintain a uniform taper from needle to needle.

It is important to note that the diameter of the bend B (see FIG. 3) between tip section $N_t$ and shank section $N_s$ of tapered needle N is substantially smaller than the diameter of untapered wire 17. As shown in FIGS. 1 and 4, wires 17 converge toward a central region 17 just below which is an integrated circuit chip 20 to be tested. Hence the bends B of the needles at the periphery of region 19 are necessarily quite close to each other. The fact that these bends have a diameter much smaller than that of the converging wires makes it possible to provide a relatively high density of needles as is required when the chip to be tested has a large number of contact pads to be engaged by the needles. This feature represents another significant advantage of the invention.

Multi-Level Assembly

Referring now to FIG. 8, there is shown an integrated circuit chip 26 having deployed thereon a large number of contact pads 27, many of which are adjacent the margins, other being more or less inwardly displaced at various positions. It is to be understood that regardless of the distribution and location of the contact pads on the IC chip, they can all be engaged by the needles of a multi-level assembly in accordance with the invention.

The number of contact pads 27 is such that a high-density, single-level test probe assembly, as illustrated in FIGS. 1 to 3, has insufficient needles in the wire array to engage all of the many contact pads on the chip. The multilevel assembly, as shown in FIGS. 9 and 10, makes available a much greater number of needles, so that all IC contact pads can be engaged for test purposes. While only two levels are shown in FIGS. 9 and 10, in practice, additional levels may be formed on the assembly in the manner to be described.

The first or uppermost level is essentially the same as in the single-level assembly. The first level includes a first radial array of fine wires 17 lying in a horizontal plane and maintained in their assigned positions as dictated by the positions of the contact pads 27 to be engaged, by a first layer 18 of dielectric material. This insulating layer, in which wires 17 are embedded, is bonded to the planar face of mounting ring 16 which is secured to card 10 to surround the port therein.

The tapered leading end of each wire is double bent to define a needle N having a shank section $N_2$ and a tip section $N_t$ terminating in a tip T which engages a respective contact pad 27 on the IC chip. The angles of the double-bent needles are the same as in the single-layer test probe assembly. The technique for forming the first level is the same as that previously disclosed.

To form a second level on the assembly, an insulating washer 28 functioning as a second mounting ring is bonded to the planar face of the first insulating layer 18. Placed on this mounting ring is a second array of fine wires 17' which lie in a horizontal plane. These wires are maintained at their assigned positions, as dictated by the positions of the contact pads 27 to be engaged thereby, by a second molded layer 29 of dielectric material. This second layer is bonded to the planar face of dielectric washer 28 in which wires 17' are embedded.

In practice, if one produces a fairly thick first layer 18, one may then dispense with washer 28 and bond the second insulating layer 29 directly to the first layer 18 and yet maintain a proper spacing between the first array of wires 17 embedded in the first layer and the second array of wires embedded in the second layer. It is important, of course, that no electrical contact be made between any wire 17 in the first array with any wire 17' in the second array. While in FIGS. 9 and 10 a wire 17' in the second layer is shown in vertical alignment with a wire 17 in the first layer, the position of the two wires are independent of each other and depend on the positions of the contact pads on the IC chip to be engaged thereby.

Inasmuch as the layers are stacked one above the other, the needle section $N_t$ of each wire 17 on the first level must be longer than the needle section of each wire 17' in the second level in order to reach the contact pads, all of which lie in a common plane.

One can add a third or even a fourth level of wire arrays as required by the number of contact pads on the IC chip. The first level is the uppermost level relative to the plane of the contact pads on the chip, and the last level is the lowermost level. The limiting factor in regard to the number of levels is the size of the contact pads on the chip and the scrub charactistics of the needles on the higher levels of the assembly; for the higher the level, the longer is the needle section of the wires.

While there has been shown and described a preferred embodiment of a multi-level test probe assembly for IC chips in accordance with the invention, it will be appreciated that many change and modifications may be made therein without, however, departing from the essential spirit thereof.

I claim:

1. A multi-level test probe assembly for testing an integrated circuit chip provided with contact pads before leads are applied to the contact pads thereof which are deployed on said chip in a common plane, said assembly comprising:

(A) a planar insulation card provided with a port having a central region, said card having on its underface traces which are connected to a plurality of test terminals connectable to test equipment for testing the chip;

(B) a mounting ring of uniform thickness formed of dielectric material surrounding said port and secured to said card at the underface thereof, said ring having a planar face parallel to the planar card;

(C) a first radial array of fine cylindrical wires having a predetermined diameter supported on the planar face of the ring and maintained in planar position thereon by a molded first layer of dielectric material adherent to said planar face of the ring, said first layer having a face parallel to said planar face, the wires of the first array being embedded in said first layer to define a first level, the wires in the first array being connected to respective traces and being cantilevered from the mounting ring across the port and converging toward the central region thereof, below which is disposed the chip to be tested, the leading end of each cantilevered wire being tapered and being double bent to define a needle having a shank section which is downwardly inclined relative to the planar face of the ring and terminating at a junction leading into a tip section terminating in a tip which engages a respective contact pad on the chip; said tip section forming an obuse angle with the shank section, the diameter of the wire at the junction of the shank section and the tip section being substantially smaller than said predetermined diameter to make possible a high needle density; and (D) a like second radial array of fine wires supported on the face of the first layer and maintained in planar position thereon parallel to the wires in the first array by a molded second layer of dielectric material, the wires of the second array being embedded in said second layer to define a second level.

2. An assembly as set forth in claim 1, wherein said first and second layers are molded of epoxy resin.

3. An assembly as set forth in claim 1, wherein said mounting ring is formed of ceramic material.

4. An assembly as set forth in claim 1, further including an insulating washer interposed between the first and second layers.

5. An assembly as set forth in claim 1, wherein all of said wires are formed of tungsten.

6. An assembly as set forth in claim 1, wherein said card is formed of synthetic plastic and said traces are formed thereon by a printed circuit technique.

* * * * *